United States Patent [19]
Cahill et al.

[11] Patent Number: 5,397,634
[45] Date of Patent: Mar. 14, 1995

[54] TRANSFERABLE PROTECTIVE COVER LAYERS

[75] Inventors: Douglas A. Cahill, Belchertown; Richard S. Himmelwright, Wilbraham; Francis J. Kearney, South Hadley; Joseph M. Roach, Granby, all of Mass.

[73] Assignee: Rexham Graphics Incorporated, South Hadley, Mass.

[21] Appl. No.: 94,989

[22] Filed: Jul. 22, 1993

[51] Int. Cl.$^6$ .............................................. B32B 3/26
[52] U.S. Cl. ................................ 428/304.4; 428/195; 428/343; 428/423.1; 428/480; 428/500; 428/507; 428/509; 428/522; 428/536; 428/913; 428/914
[58] Field of Search ............... 428/336, 480, 481, 514, 428/522, 537.5, 913, 914, 195, 304.4, 343, 423.1, 500, 507, 509, 536

[56] References Cited

U.S. PATENT DOCUMENTS

| | | | |
|---|---|---|---|
| 4,077,830 | 3/1978 | Fulwiler | 156/249 |
| 4,343,855 | 8/1982 | Conder | 428/332 |
| 4,522,881 | 6/1985 | Kobayashi et al. | 428/336 |
| 4,921,776 | 5/1990 | Taylor, Jr. | 430/293 |
| 4,977,136 | 12/1990 | Fujiwara et al. | 503/227 |
| 5,217,773 | 6/1993 | Yoshida | 428/40 |

Primary Examiner—Pamela R. Schwartz
Attorney, Agent, or Firm—Breneman, Georges & Krikelis

[57] ABSTRACT

A novel transfer element for protecting, graphic arts images is disclosed. The transfer element consists essentially of, a temporary carrier layer, a substantially silane-free protective layer, and an adhesive layer permanently adhered to the protective layer. In particular, the temporary carrier layer is a polymeric sheet material, a foraminous sheet material, or composites thereof; and the protective layer comprises a cross-linked cellulose ester. When the transfer element of this invention is used, the temporary carrier layer is removed, as the final step, from the protective layer which remains substantially intact. The transfer element is useful in manufacturing protected images of all sizes and is particularly suited to protecting large format images such as billboards.

25 Claims, No Drawings

TRANSFERABLE PROTECTIVE COVER LAYERS

BACKGROUND OF THE INVENTION

1. Field of the Invention

This invention relates to coverings for sealing and protecting surfaces. More particularly, this invention relates to transferable, scratch-resistant cover layers for sealing and protecting graphic-arts images, particularly, large size, full color images.

2. Description of Related Art

A variety of graphic arts processes are used in the printing, office copy, decorative arts and advertising industries. Such graphic arts processes include conventional processes to produce photographs; litho films; pre-press proofs; printed publications; xerographic, electrographic, and ink-jet images; and the like. In preparing such graphic-arts, image-bearing surfaces, it is frequently desirable to provide a protective covering to prevent limited scratching, marring, or other damage to the image-bearing surface. Such a covering should be optically clear so as not to obscure or distort the image. However, such a covering may lower the gloss of the surface. The covering should also have flexibility, durability, and good adhesion to the image-bearing element.

Graphic-art elements have been provided with a great variety of protective coverings. Fulwiler, U.S. Pat. No. 4,077,830 teaches that photographic elements such as positives or negatives used for contact printing can be protected by application of a thin transparent sheet of resin material having a thin coating of a transparent pressure-sensitive adhesive. To avoid image distortion during printing, both the resin sheet and the adhesive layer must be extremely smooth. The preferred protective resin sheet is a high gloss polyethylene terephthalate film.

Taylor, U.S. Pat. No. 4,921,776 discloses a method of providing a lower gloss protective covering for a pre-press color proof having an image-bearing surface. In the disclosed process, a thin, substantially transparent integral film, which consists essentially of a mixture of at least two slightly incompatible polymers, is laminated to the image-bearing surface. A second "wetting" or adhesive layer may be disposed between the integral film and the image-bearing surface. Also disclosed, are additional layers adjacent to the protective and adhesive layers to facilitate handling and storage. The additional layers are removed during the lamination process. Suitable materials disclosed for these additional coverings are silicone-treated polyester, polyethylene, etc., which release readily from the layer they serve to protect. Silicone-treated polyethylene terephthalate support is specifically exemplified.

Conder, U.S. Pat. No. 4,343,855 discloses preformed abrasion resistant coating layers derived from epoxy-silanes or acryloxy-silanes. The layers are applied to surfaces by means of a composite comprising a release liner, the abrasion resistant layer, and a thermosoftenable adhesive layer. It is disclosed that the release liner may be formed of smooth polymeric film to which the abrasion resistant coating composition is not readily bondable (e.g., polyester, polyolefin, etc.), or silicone treated surfaces. Specifically exemplified is the extrusion bar coated abrasion resistant coating composition onto polyethylene terephthalate film. It is further disclosed that the thermosoftenable adhesive layer must be coated onto or combined with the abrasion resistant layer prior to complete curing of the abrasion resistant layer, since that layer has been found to be so completely non-reactive when fully cured that thermoplastic layers will not readily bond to its surface.

Although advances have been made in the protection of graphic arts images, conventional systems and processes are still limited. In particular, even the thinnest of the currently used laminating films impart a significant curl to the side of the image on which the film is applied. In order for the image to lay flat, an offsetting lamination typically is carried out on the opposite side of the image which essentially doubles the expense for providing the needed protection. In instances when sections of the protected image element are cut out by die cutting processes, current laminating films can cause excessive wear to cutting edges of die cutting equipment leading to increased replacement costs and production down-time. When other means are used to protect images, such as by applying overcoats of varnish or other clear lacquers, image distortion may occur due to the chemicals and solvents employed, and safety and environmental concerns typically are enhanced. Accordingly, there continues to be a need for a simplified transfer composite to provide distortion-free protection to graphic-arts images, and particularly, for use on large format posters, billboards and the like. In addition to abrasion resistance, there is also a need to provide such images with sealed protection from environmental or ambient effects and components which degrade the image.

SUMMARY OF THE INVENTION

These needs are met by the use of the protective element of this invention which is a transfer element for protecting image surfaces consisting essentially of, in the order given;

A) a temporary carrier layer taken from the group consisting of a polymeric sheet material, a foraminous sheet material, and composites thereof, B) a substantially silane-free protective layer which comprises a cross-linked cellulose ester, wherein the protective layer may be removed, substantially intact, from the temporary carrier layer, and C) an adhesive layer permanently adhered to the protective layer.

In an added embodiment of this invention, a removable coversheet is adhered to the adhesive layer to protect the transfer element during storage and handling.

A further embodiment of this invention is a process for protecting a surface of a graphics art image consisting essentially of the steps of I) applying to the surface of the graphics art image, a transfer element which consists essentially of, in the order given;

A) a temporary carrier layer taken from the group consisting of a polymeric sheet material, a foraminous sheet material, and composites thereof, B) a substantially silane-free protective layer which comprises a cross-linked cellulose ester, and C) an adhesive layer; wherein the adhesive layer is contacted to the surface of the graphics art image using an applied pressure and is activated to form a laminate; and II) removing the temporary carrier layer from the protective layer of the laminate, wherein the protective layer remains substantially intact and permanently adhered to the adhesive layer.

DETAILED DESCRIPTION OF THE INVENTION

The present invention relates to a novel transfer element for protecting surfaces of graphic-arts images and the like. The transfer element consists essentially of, a temporary carrier layer, a substantially silane-free protective layer, and an adhesive layer permanently adhered to the protective layer. In particular, the temporary carrier layer is a polymeric sheet material, a foraminous sheet material, or composites thereof; and the protective layer comprises a cross-linked cellulose ester. When the transfer element of this invention is used, the temporary carrier layer is removed, as the final step, from the protective layer which remains substantially intact. Optionally, a removable coversheet may be temporarily adhered to the adhesive layer surface for protection during storage and manipulation prior to use of the transfer element.

The temporary carrier layer functions as a temporary support to the superposed layers during the processing steps and may be any web or sheet material possessing suitable flexibility, dimensional stability and adherence properties to the protective layer. Typically, the web or sheet material is a flexible polymeric film, e.g., such as polyethylene terephthalate film and the like, a foraminous material, e.g., such as a paper sheet and the like, or composites thereof, e.g. polymeric coated or impregnated paper, and the like. Typically, the surface of the carrier layer is substantially smooth.

The silane free protective layer is a polymeric film material which is resistant to scratching, abrasions and the like, and to environmental components and contaminants. The protective layer is visually transparent in at least one region within the visible spectral region and typically is transparent throughout the visible spectral region. The protective layer is substantially free of covalently bonded silicon moieties such as silyl moieties and is comprised of one or more crosslinked cellulose esters. Preferred cellulose esters are cellulose acetate propionate and cellulose acetate butyrate. The crosslinking system may be chosen from a variety of conventional crosslinking agents, e.g., such as the acid catalyzed melamine/formaldehyde crosslinking resins, of which hexamethoxymethylmelamine catalyzed by $p$-toluenesulfonic acid is preferred. The protective layer may also contain other polymeric materials in addition to the crosslinked cellulose esters. Such other polymeric materials which are useful in making this layer include polyvinyl chloride; polyvinyl butyral; polyesters; acrylics; polyurethanes; styrene copolymers, e.g., such as styrene acrylonitrile; and combinations thereof. This layer may contain added components which may enhance the presentation of the underlying image and/or protect it from environmental damage. Thus this layer may contain a component which strongly absorb ultraviolet radiation thereby reducing damage to underlying images by ambient ultraviolet light, e.g., such as 2-hydroxy benzophenones; oxalanilides; aryl esters and the like; hindered amine light stabilizers, such as bis(2,2,6,6-tetramethyl-4-piperidinyl) sebacate and the like; and combinations thereof. Other added components include infrared absorbing or reflecting materials for thermal protection; colorants and/or fluoresent optical brighteners to provide desired graphic appearances; and the like. The protective layer may be provided with a matt surface. This matt surface can be obtained by including in the layer particles sufficiently large to give surface irregularities to the layer. Particles of average diameter in the range of about 1 $\mu$m to about 15 $\mu$m are suitable. Alternatively, the matt surface may be transferred from the surface of the temporary carrier layer. In this instance, the protective layer is coated onto the matt surface of the temporary carrier layer, e.g., a drafting film surface, and when the carrier layer is subsequently removed, the protective layer is left with a matt surface corresponding to that of the carrier layer. The protective layer typically has a thickness in the range of about 0.5 $\mu$m to about 10 $\mu$m and preferably in the range of about 1 $\mu$m to about 4 $\mu$m. Such layers typically will withstand scribing with the point of a 4H pencil without breakthrough.

The adhesive layer functions to permanently adhere the protective layer to the surface of the graphics art image during the process of using the transfer element. As with the protective layer, the adhesive layer is visually transparent in at least one region within the visible spectral region and typically is transparent throughout the visible spectral region. In the instance where both the adhesive layer and the protective layer are visually transparent in one region, at least a portion of the regions should be common to both layers. The adhesive layer may be chosen from a variety of conventional adhesive materials, e.g., such a thermally activated, pressure sensitive, or photo activated adhesives, and the like. Typically, the adhesive material will be a thermally activated adhesive material comprised of thermoplastic polyurethanes; polycaprolactone; acrylic copolymers; and combinations thereof. Representative thermally activated adhesive materials include Morthane ® CA-116 urethane resin (a product of Morton International); Tone ® Polymer P767E biodegradable plastic resin (a product of Union Carbide); Elvax ® 240 vinyl resin (a product of Dupont Chemicals); and the like. This layer may also contain components which strongly absorb ultraviolet radiation thereby reducing damage to underlying images by ambient ultraviolet light such as described for the protective layer supra.

When present on the transfer element, the removable coversheet functions to protect the adhesive layer surface during storage and manipulation prior to use of the transfer element and may be any web or sheet material possessing suitable flexibility, dimensional stability and adherence properties to the adhesive layer. Typically, the web or sheet material is a flexible polymeric film, e.g., such as polyethylene, polypropylene, polyethylene terephthalate and the like; a foraminous material, e.g., such as a paper sheet and the like; or composites thereof. The web or sheet may also be surface treated or coated with a material to enhance desired release characteristics, e.g., such as treatment with a silicone release agent and the like. In practice, the adherence of the removable coversheet to the adhesive layer is substantially less than the adherence of the temporary carrier layer to the protective layer.

The protective transfer element of this invention may be used to protect a variety of image surfaces produced by conventional graphic arts processes. Such processes include processes to produce color or black-and-white photographs; diazotype prints; phototools; litho films; pre-press proofs; printed publications; office copies; holographic, xerographic, electrographic, and ink-jet images; and the like. The use of the protective transfer element of this invention will now be illustrated by reference to a conventional imaged electrograhic element having a toned image layer thereon. In this process, the removable cover sheet, if present, is first removed from the surface of the adhesive layer. The adhesive layer is then contacted and adhered to the toned image layer using an applied pressure to the surfaces of the temporary carrier layer and the imaged electrographic element to form a laminate. When only a pressure sensitive adhesive is used, the applied pressure must be sufficient to activate the adhesive to form a permanent bond between the layers. The protective element is typically applied to the toned image layer under an applied pressure of about 70 p.s.i. (4.9 kg/cm$^2$) or greater and preferably under an applied pressure of about 80 p.s.i. (5.6 kg/cm$^2$) or greater. The term "applied pressure" is intended to mean the absolute pressure which is applied to a unit area of the surface as conventionally derived from the geometry of the pressure means, e.g., the geometry of the laminating nip, in combination with a measurement means, e.g., a calibrated gauge pressure. Suitable means that may be used to apply pressure include platen presses; counterpoised, double roll, laminating devices; scanning, single roll, laminating devices; hand-held, rollers and squeegees; and the like. Typically roll laminating devices are preferred since they readily minimize air entrapment between the adhesive layer and the toned image layer during the application process step. Vacuum may be applied with such devices to further eliminate air entrapment. Typically, the adhesive layer is a thermally activated adhesive. In this instance, heat is typically applied to the adhesive layer prior to and/or concurrently with the application of the applied pressure. While the temperature used to activate the adhesive depends on the nature of the material, the protective element is applied to the toned image layer at a temperature of about 80° C. or greater and preferably about 100° C. or greater. Typical application temperatures range from about 100° C. to about 150° C. Typically, temperature is measured on the surface of the heated roll or platen by means of temperature sensitive tape. Thus the protective element may be heated prior to its application by radiant or contact heaters and then applied while hot to the toned image layer. Alternatively the pressure means itself may also function as a heater, e.g., such as a hot roll laminator, or both prior and concurrent hating may be used in combination. The adhesive layer may also be a photo activated adhesive. In this instance, the adhesive layer typically is irradiated with actinic radiation either concurrently with or subsequent to the application of the applied pressure. In this instance, the temporary carrier layer and the protective layer should be sufficiently transparent to the actinic radiation which activates the photo adhesive. When the adhesive layer is thermally or photo activated, the applied pressure may be just sufficient to bring the surface of the adhesive layer into intimate contact with the surface of the toned image layer. Heat may be used prior to and/or concurrently with the application of the applied pressure to accelerate the pressure lamination. Alternatively the pressure means itself may also function as a heater, e.g., such as a hot roll laminator, or both prior and concurrent hating may be used in combination. The laminating temperature may range from about 90° C. to about 150° C. and preferably between about 90° C. and about 130° C. After lamination is complete the temporary carrier layer is removed from the surface of the protective layer of the laminated image element. In this process step, the temporary carrier layer is peeled, using a peel force, from the surface of the protective layer to form the protected electrographic image. Typically, the temporary carrier layer is peeled at room temperature with a peel force directed at an angle of 90° or more from the surface of the protective layer. The peel rate and the peel force are not critical and preferred values will depend on the nature of the protective and carrier layer materials. The temporary carrier layer may be removed at any time after the formation of the laminated image element and may be left adhered for extra protection during storage. While the temporary carrier layer typically is removed at room temperature, the laminated image element may be heated to facilitate removal.

The protective transfer element of this invention will now be illustrated by the following examples but is not intended to be limited thereby.

EXAMPLE 1

A protective element was prepared as follows: An abrasion resistant coating solution was prepared from the following ingredients.

| Ingredient | Parts By Weight |
| --- | --- |
| Propylene monomethyl ether | 30.41 |
| Ethyl acetate | 26.41 |
| Toluene | 10.96 |
| Butyrolactone | 9.26 |
| Cellulose acetate propionate[1] | 20.06 |
| Hexamethoxymethylmelamine[2] | 2.64 |
| Para-toluene sulfonic acid | 0.53 |
| Amorphous silica (ave. particle size 3 μm) | 0.01 |

[1] Cellulose acetate propionate is C.A.P. 504-0.2 cellulose ester, a product of Eastman Chemicals.
[2] Hexamethoxymethylmelamine is Cymel ® 301 melamineformaldehyde crosslinking resin, a product of Cyanamid Corporation.

The cellulose acetate propionate was added to the solvent blend slowly under a high speed Lightnin ® mixer. When fully dissolved, the amorphous silica was then added and mixed for five minutes. The melamine resin and acid catalyst were added and mixed for an additional 15 minutes. The resulting lacquer was then coated on a 25.4 μm (0,001 inch) thick, untreated, polyethylene terephthlate film using a meyer rod and dried at 240° F. (115° C.) for two minutes to give a dry coating thickness of 2.5 μm.

An adhesive layer coating solution was prepared from the following ingredients.

| Ingredient | Parts By Weight |
| --- | --- |
| Methyl ethyl ketone | 77.96 |
| Toluene | 10.00 |
| Morthane ® CA-116 urethane resin[3] | 12.00 |
| Amorphous silica (ave. particle size 3 μm) | 0.04 |

[3] Morthane ® CA-116 urethane resin is a product of Morton-Thiokol and is a hydroxyl terminated polyurethane elastomer.

The coating solution was made by mixing the methyl ethyl ketone, toluene and urethane resin for 30 minutes with a high speed Lightnin ® mixer. Amorphous silica was then added and mixed for 5 minutes. The solution was overcoated onto the previously coated film using a meyer rod and dried at 240° F. (115° C.) for two minutes to give a dry coating thickness of 2.0 μm to form the protective element. The surface of the adhesive layer was substantially tack-free and the transfer element could be stored in sheet or roll form without blocking.

The laminating steps were performed by first laying the protective element in such a way that the adhesive layer of the protective element and the imaged layer of an electrographic element were contacting each other. This composite was then passed through the hot nip of an Image Technologies, Model 6000 laminator at a temperature of 115°° C. (240° F.) and a cylinder pressure of 80 p.s.i. (5.6 kg/cm$^2$). After the laminate had cooled to room temperature, the polyethylene terephthalate support was stripped from the protective layer adhered to the electrographic image. The protected electrographic image produced could withstand scribing with a 4H pencil with no removal of the protective layer or image.

EXAMPLE 2

Example 1 was repeated using the same electrographic and protective elements and the same process steps except that the adhesive layer of the protective element was of the following composition:

| Ingredient | Parts By Weight |
|---|---|
| Toluene | 80.00 |
| Propylene glycol monomethyl ether | 5.00 |
| Polycaprolactone[4] | 15.00 |
| Amorphous silica (ave. particle size 3 μm) | 0.04 |

[4]Polycaprolactone which is Tone ® Polymer P-767E biodegradable plastic resin, a product of Union Carbide.

The coating solution was made by mixing the toluene, propylene glycol monomethyl ether and polycaprolactone for 30 minutes with a high speed Lightnin ® mixer. Amorphous silica was then added and mixed for 5 minutes. The solution was overcoated onto the previously coated abrasion resistant film using a meyer rod and dried at 240° F. (115° C.) for two minutes to give a dry coating thickness of 2.0 μm to form the protective element. The steps of the process were then carried out as described in Example 1.

EXAMPLE 3

Example 1 was repeated using the same electrographic and protective elements and the same process steps except that the abrasion resistant coating solution was prepared from the following ingredients.

| Ingredient | Parts By Weight |
|---|---|
| Propylene glycol monomethyl ether | 30.41 |
| Ethyl acetate | 26.41 |
| Toluene | 10.96 |
| Butyrolactone | 9.26 |
| Cellulose acetate propionate[1] | 20.06 |
| Hexamethoxymethylmelamine[2] | 2.64 |
| Para-toluene sulfonic acid | 0.53 |
| Amorphous silica (ave. particle size 3 μm) | 0.01 |
| Tinuvin ® 1130[5] UV absorber | 1.50 |

[5]Tinuvin ® 1130 UV absorber, a product of Ciba-Geigy, is the reaction product of polyethylene glycol 300 and the methyl ester of beta-(3-(2h-benzotriazole-2-yl)-4-hydroxy-5-tert-butylphenyl)propionic acid.

The cellulose acetate propionate was added to the solvent blend slowly under a high speed Lightnin ® mixer. When fully dissolved, the amorphous silica was then added and mixed for five minutes. The melamine resin, acid catalyst and Tinuvin ® 1130 UV absorber were added and mixed for an additional 15 minutes. The resulting lacquer was then coated on a 25.4 μm (0.001 inch) thick, untreated, polyethylene terephthlate film using a meyer rod and dried at 240° F. (115° C.) for two minutes to give a dry coating thickness of 2.5 μm. As described in Example 1, the adhesive layer was then prepared and coated and then the steps of the process were carried out.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A transfer element for protecting image surfaces consisting essentially of, in the order given;
   A) a temporary carrier layer selected from the group consisting of a polymeric sheet material, a foraminous sheet material, and composites thereof,
   B) a substantially silane-free protective layer which consists essentially of a cross-linked cellulose ester, wherein the protective layer may be removed, substantially intact, from the temporary carrier layer, and wherein the protective layer will withstand scribing with the point of a 4H pencil without breakthrough, and
   C) an adhesive layer permanently adhered to the protective layer.

2. The transfer element of claim 1 wherein the temporary carrier layer is a flexible web or sheet material.

3. The transfer element of claim 1 wherein the temporary carrier layer is a polymeric film.

4. The transfer element of claim 3 wherein the polymeric film is polyethylene terephthalate or a polyolefin.

5. The transfer element of claim 1 wherein the temporary carrier layer is a composite of the polymeric sheet material and the foraminous sheet material.

6. The transfer element of claim 5 wherein the polymeric sheet material forms at least one surface of the composite, said surface being contiguous to the protective layer.

7. The transfer element of claim 1 wherein the cellulose ester is selected from the group consisting of cellulose acetate propionate; cellulose acetate butyrate; and combinations thereof.

8. The transfer element of claim 1 wherein the protective layer contains a second polymeric film material selected from the group consisting of polyvinyl chloride; polyvinyl butyral; polyesters; acrylics; polyurethanes; styrene copolymers; styrene acrylonitrile; and combinations thereof.

9. The transfer element of claim 1 wherein the protective layer is visually transparent in at least one region within the visible spectral region.

10. The transfer element of claim 1 wherein the protective layer has a thickness in the range of about 0.5 μm to about 10 μm.

11. The transfer element of claim 1 wherein the protective layer contains a UV absorbing material dispersed therein.

12. The transfer element of claim 1 wherein the adhesive layer comprises a thermally activated adhesive material.

13. The transfer element of claim 12 wherein the thermally activated adhesive material is a thermoplastic polyurethane, polycaprolactone, acrylic copolymer, or combinations thereof.

14. The transfer element of claim 12 wherein the adhesive layer is activated at a pressure and a temperature which is above ambient pressure and temperature.

15. The transfer element of claim 14 wherein the adhesive layer is activated under an applied pressure of about 70 p.s.i. (4.9 kg/cm$^2$) or greater and at a temperature of about 80° C. or greater.

16. The transfer element of claim 1 wherein the adhesive layer comprises a photo-activated adhesive material.

17. The transfer element of claim 1 wherein the adhesive layer is substantially tack-free.

18. The transfer element of claim 1 wherein the adhesive layer is visually transparent in at least one region within the visible spectral region.

19. The transfer element of claim 1 wherein the adhesive layer contains a UV absorbing material dispersed therein.

20. A transfer element for protecting image surfaces consisting essentially of, in the order given;
   A) a temporary carrier layer selected from the group consisting of a polymeric sheet material, a foraminous sheet material, and composites thereof,
   B) a substantially silane-free protective layer which consists essentially of a cross-linked cellulose ester, wherein the protective layer may be removed, substantially intact, from the temporary carrier layer, wherein the protective layer will withstand scribing with the point of a 4H pencil without breakthrough,
   C) an adhesive layer permanently adhered to the protective layer, and
   D) a removable coversheet is adhered to the adhesive layer.

21. The transfer element of claim 20 wherein the removable coversheet is selected from the group consisting of a polymeric sheet material, a foraminous sheet material, and composites thereof.

22. The transfer element of claim 21 wherein the removable coversheet is a flexible polymeric film.

23. The transfer element of claim 22 wherein the flexible polymeric film is polyethylene terephthalate, polyethylene, or a polypropylene.

24. The transfer element of claim 20 wherein the removable coversheet is surface treated or coated with a material to enhance desired release characteristics.

25. The transfer element of claim 24 wherein the removable coversheet is surface treated with a silicone release agent.

* * * * *